United States Patent [19]
Chen et al.

[11] Patent Number: 5,462,636
[45] Date of Patent: Oct. 31, 1995

[54] METHOD FOR CHEMICALLY SCRIBING WAFERS

[75] Inventors: George Y. Chen, Los Gatos; Edward H. P. Lee, San Jose, both of Calif.

[73] Assignee: International Business Machines Corporation, Armonk, N.Y.

[21] Appl. No.: 174,108

[22] Filed: Dec. 28, 1993

[51] Int. Cl.⁶ ............ B44C 1/22; H01L 21/306; C03C 15/00
[52] U.S. Cl. ............ 216/17; 437/226; 437/227; 148/DIG. 28; 216/22
[58] Field of Search ............ 437/226, 227; 156/645; 148/DIG. 28

[56] References Cited

U.S. PATENT DOCUMENTS

| | | |
|---|---|---|
| 3,615,956 | 10/1971 | Irving et al. . |
| 4,096,619 | 6/1978 | Cook, Jr. . |
| 4,190,872 | 2/1980 | Jones, Jr. et al. . |
| 4,219,855 | 8/1980 | Jones, Jr. . |
| 4,226,018 | 10/1980 | Nakanishi et al. . |
| 4,317,149 | 2/1982 | Elser et al. . |
| 4,489,484 | 12/1984 | Lee . |
| 4,617,730 | 10/1986 | Geldermens et al. . |
| 4,652,954 | 3/1987 | Church . |
| 4,759,118 | 6/1988 | Nakashima . |
| 4,814,296 | 3/1989 | Jedlicka et al. . |
| 4,904,617 | 2/1990 | Muschke . |
| 4,961,821 | 10/1990 | Drake et al. . |
| 4,978,639 | 12/1990 | Hua et al. . |
| 5,017,512 | 5/1991 | Takagi .................... 437/227 |
| 5,024,970 | 6/1991 | Mori . |
| 5,041,932 | 8/1991 | Hamilton . |
| 5,095,613 | 3/1992 | Hussinger et al. . |

FOREIGN PATENT DOCUMENTS

| | | | |
|---|---|---|---|
| 55-12443 | 9/1980 | Japan | 437/227 |
| 55-115343 | 9/1980 | Japan | 437/227 |
| 56-167350 | 12/1981 | Japan | 437/226 |
| 60-216565 | 10/1985 | Japan | 437/227 |
| 62-21239 | 1/1987 | Japan | 437/226 |
| 62-26839 | 2/1987 | Japan | 437/226 |
| 1-196850 | 8/1989 | Japan | 437/227 |
| 2-54563 | 1/1990 | Japan | 437/226 |
| 2-45955 | 2/1990 | Japan | 437/227 |
| 4-56250 | 2/1992 | Japan | 437/226 |

Primary Examiner—Olik Chaudhuri
Assistant Examiner—H. Jey Tsai
Attorney, Agent, or Firm—James C. Wilson; Duke W. Yee; Andrew J. Dillon

[57] ABSTRACT

A method for creating scribe lines on a wafer having an electronic device constructed therein. A plurality of boundary segments is formed on the wafer to define a region on the wafer. This region encompasses the electronic device. An insulating layer is formed over the boundary segments, wherein the insulating layer covers the electronic device. A portion of the insulating layer is removed such that each of the segments is exposed. The boundary segments are then etched away to expose the wafer and form a plurality of scribe lines, wherein the wafer may be cut at the scribe lines to separate the electronic device from the wafer while minimizing damage to the electronic device.

26 Claims, 9 Drawing Sheets

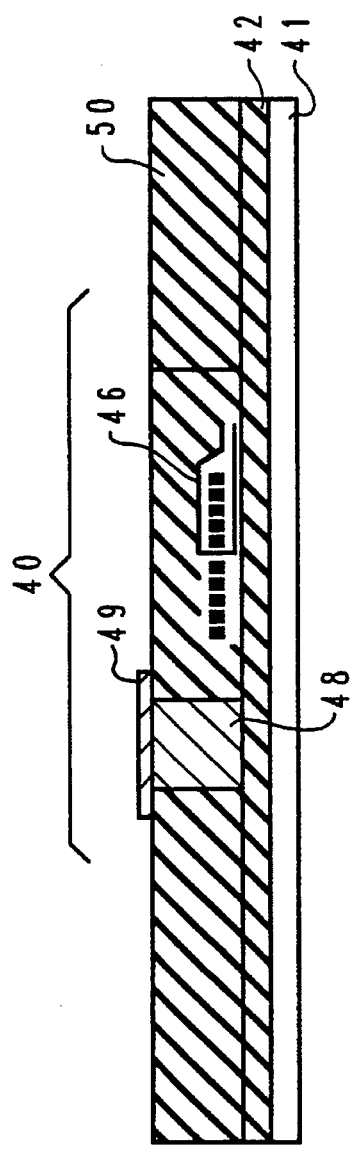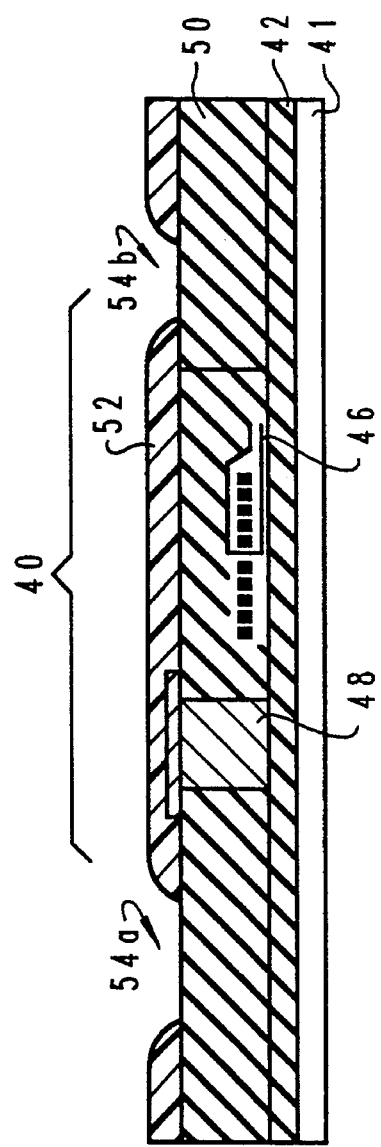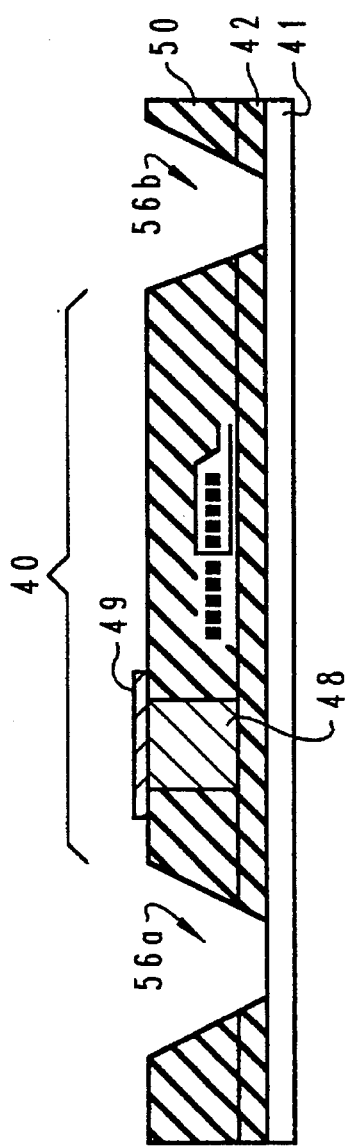
Fig. 2A
Fig. 2B
Fig. 2C

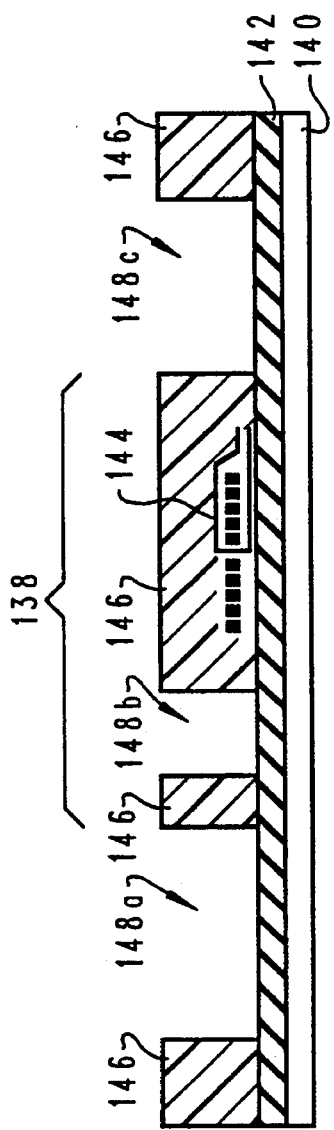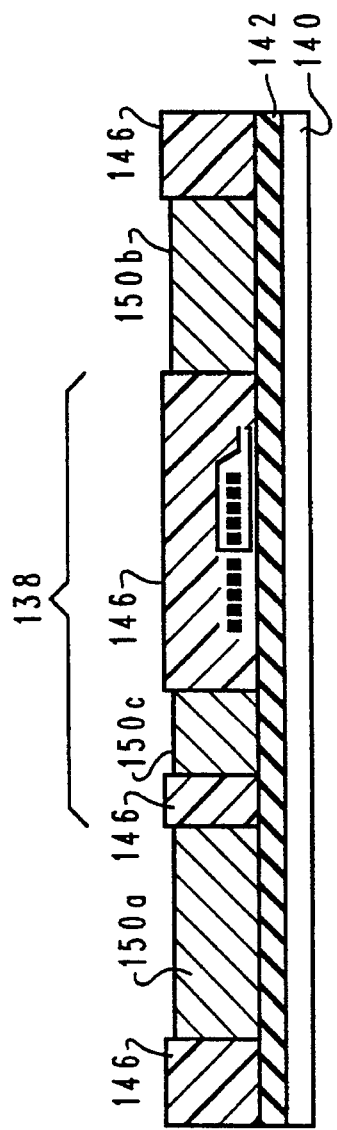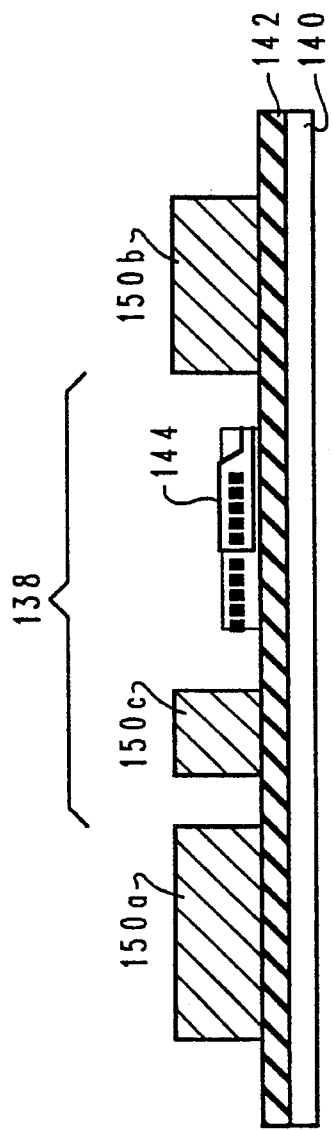
Fig. 3A
Fig. 3B
Fig. 3C

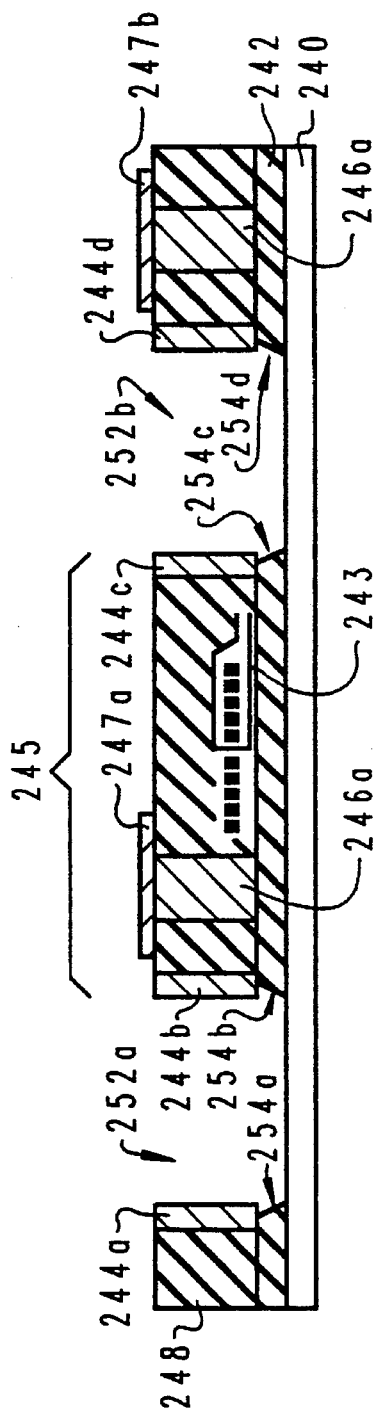
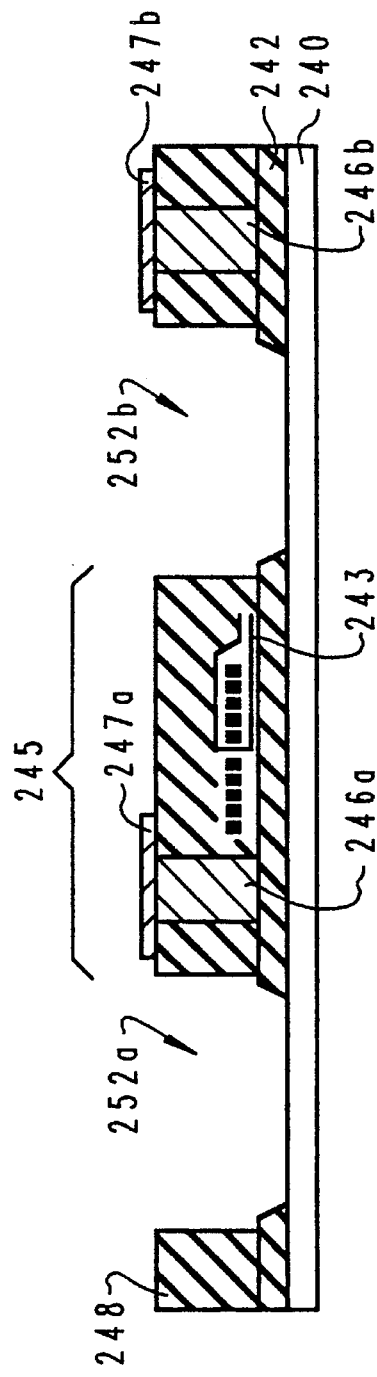
Fig. 4D
Fig. 4E

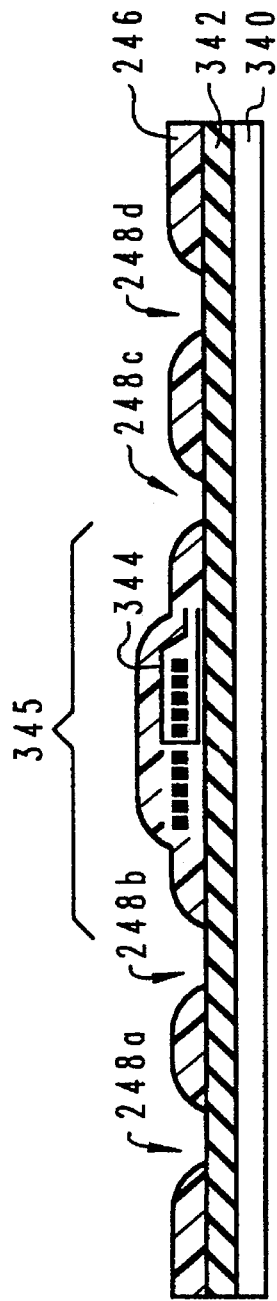
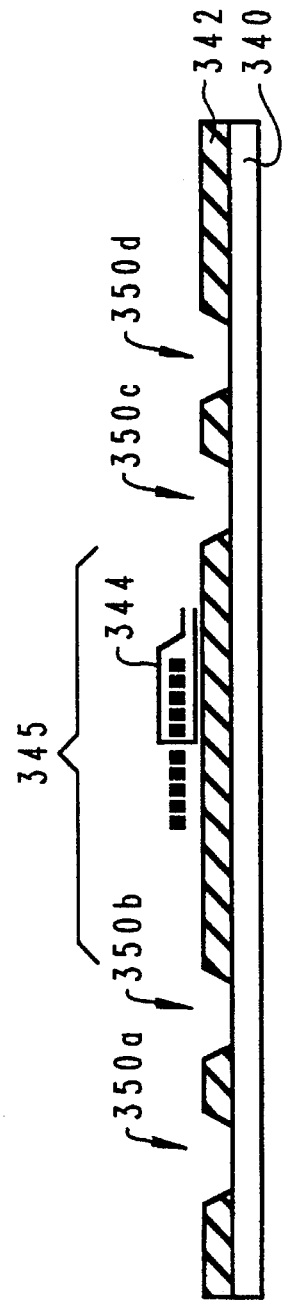
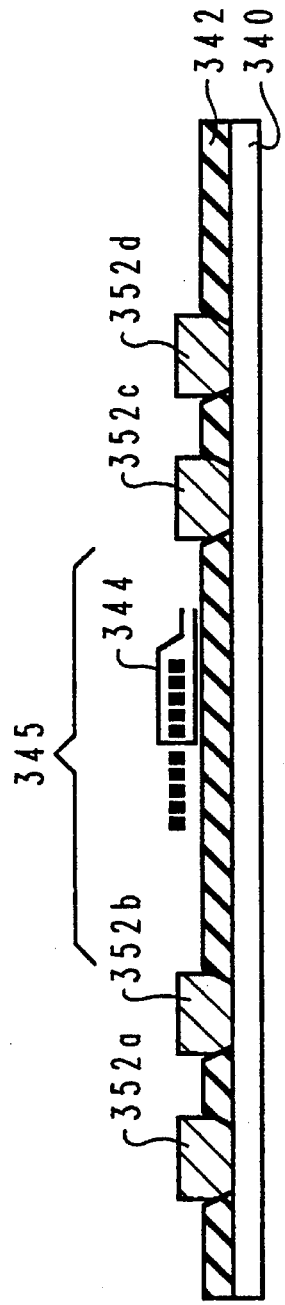
Fig. 5A
Fig. 5B
Fig. 5C

METHOD FOR CHEMICALLY SCRIBING WAFERS

BACKGROUND OF THE INVENTION

1. Technical Field

The present invention relates generally to a process for separating a wafer into individual dies and in particular to a process for scribing wafers containing magnetic head sliders. Still more particularly, the present invention provides a chemical scribing process to improve magnetic head slider yields.

2. Description of the Related Art

Magnetic storage systems are employed for storing large amounts of information and are typically utilized for long term storage in a data processing system, such as a work station or a personal computer. In particular, magnetic disk drive systems are employed to read and write information to and from magnetic disks. A magnetic head assembly and a slider are utilized in a magnetic disk system, such as a hard disk drive, and move relative to the surface of a magnetic disk in a hard disk drive.

It is well known that during operation, a magnetic head assembly in, for example, a hard disk drive, floats a very small distance above the magnetic recording medium (i.e., the hard disk), which is rotated at high speeds. These magnetic head assemblies include a electromagnetic head, such as a magnetic transducer, mounted on a movable arm to read or write information on the hard disk. The magnetic disk system moves the magnetic head to a desired radial position over the surface of the rotating hard disk, where the magnetic head reads or writes information. Typically, the magnetic head is integrally formed in a carrier called a "slider". A slider provides mechanical support for the magnetic head and the electrical connections between the magnetic head and the remainder of the magnetic disk system.

In particular, a slider for a hard disk drive is usually fabricated on a wafer. The substrate of a wafer on which a slider is fabricated typically is constructed of a hard ceramic material such as ferrite or $Al_2O_3$—TiC. The electronic devices, which make up the magnetic head assembly in a slider, are usually encapsulated in alumina ($Al_2O_3$). A large number of sliders may be fabricated on a single wafer. The number of sliders that may be fabricated on a single wafer is determined by the wafer size, the size of the sliders, and the area required for breaking up the wafer into separate sliders. Typically, a wafer is scribed and then broken up into a number of separate sliders.

Currently while breaking the wafer into separate sliders, the wafer is sawed utilizing one or more rotating blades which may be stacked in a gang. Typically, scribe lines are first cut though the alumina on the wafer. A fine blade is normally employed to create these scribe lines. In separating the sliders, the substrate is then cut with a second coarser blade in view of the substrate's hardness. Mechanical scribing and slicing may cause chips and cracks in the alumina. Chips trapped between the blade and the substrate may damage the sliders and cracks reaching the electronic devices may render a particular slider unusable. Width, sidewall slope, and placement of scribe lines may also fluctuate as the blade heats up and wears. Consequently, current manufacturing techniques may result in losses, thereby reducing yield, typically as a result of cracks in the alumina reaching the electronic devices in the slider. In addition, increased manufacturing time is required for mechanical scribing and cutting. Therefore, an improved process for separating sliders from wafers and thereby increasing the yield is desirable.

SUMMARY OF THE INVENTION

It is therefore one object of the present invention to provide an improved method for separating a wafer into individual dies.

It is another object of the present invention to provide an improved process for scribing wafers containing magnetic head sliders.

It is yet another object of the present invention to provide a chemical scribing process to improve magnetic slider yields The foregoing objects are achieved as is now described. The present invention provides a method for creating scribe lines on a wafer having electronic devices constructed therein. A plurality of boundary segments are formed on the wafer to define a region on the wafer. Each region encompasses an electronic device. An insulating layer is then formed over the boundary segments, wherein the insulating layer covers each electronic device. A portion of the insulating layer is then removed such that each of the boundary segments is exposed. The boundary segments are then etched away to expose the wafer and form a plurality of scribe lines, wherein the wafer may be cut along the scribe lines to separate each electronic device from the wafer while minimizing damage to the electronic devices.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 2A–2C are cross-sectional views of a slider during processing in accordance with a preferred embodiment of the present invention;

FIGS. 3A–3E depict cross-sectional views of a slider during processing in accordance with a preferred embodiment of the present invention;

FIGS. 4A–4E are cross-sectional views of a slider during processing in accordance with a preferred embodiment of the present invention; and FIGS. 5A–5F depict cross-sectional views of a slider during processing in accordance with a preferred embodiment of the present invention.

DETAILED DESCRIPTION OF THE PREFERRED EMBODIMENTS

The process steps and structures described below do not form a complete process flow for manufacturing sliders. The present invention may be practiced in conjunction with known fabrication techniques currently utilized in the art, and only so much of the commonly practiced process steps are included as necessary for an understanding of the present invention. The figures representing the cross-sections of portions of a slider during fabrication are not drawn to scale, but are instead drawn so as to illustrate the important features of the invention.

Figure 1A:
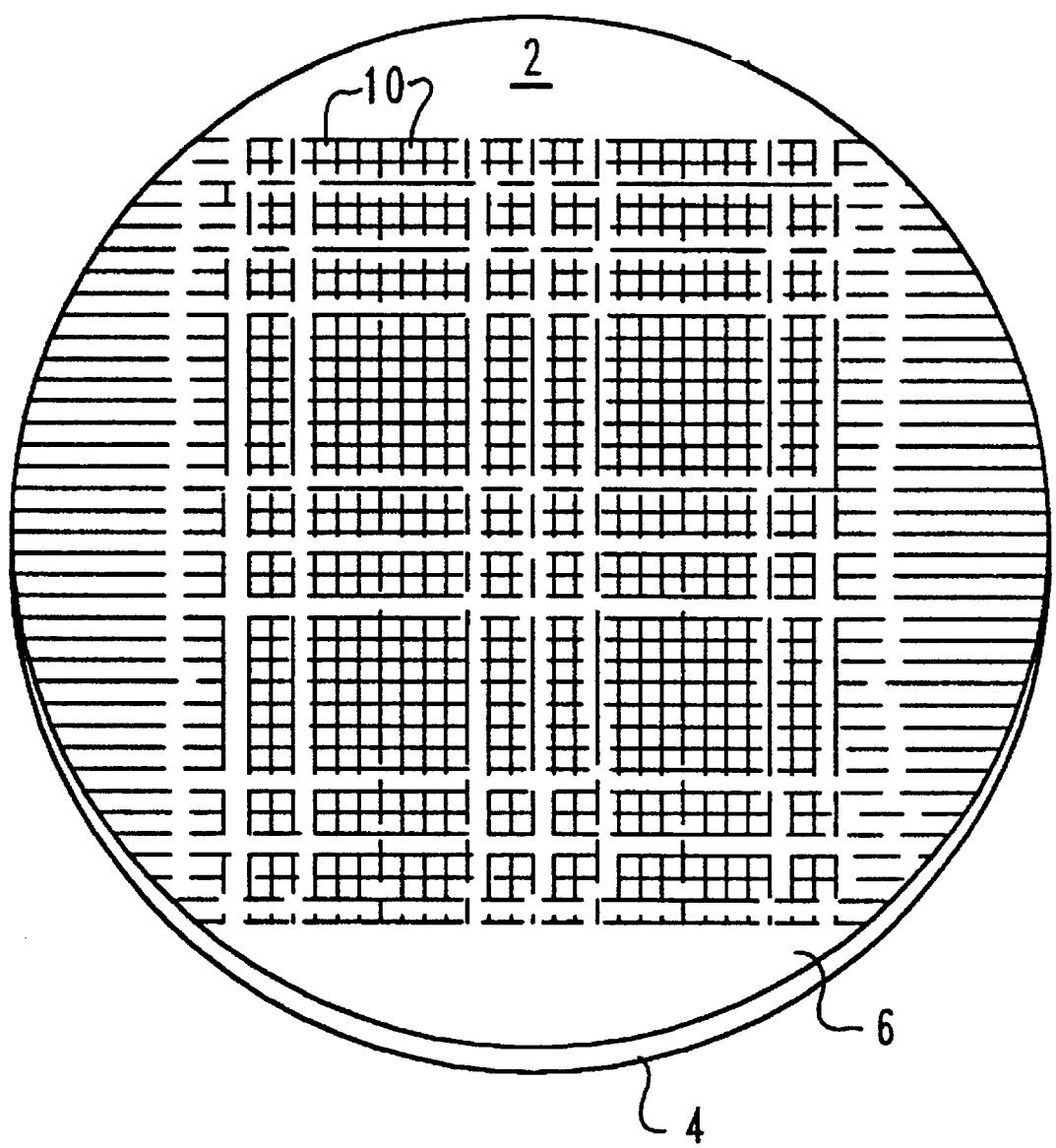
FIGS. 1A–1C depict a processed wafer and a detailed structure produced thereof in accordance with a preferred embodiment of the present invention.

Referring now to FIG. 1A, a wafer 2 is depicted which includes a substrate 4 that may be constructed of any suitable and well known slider material such as ferrite, $Al_2O_3$—TiC, or the like. An insulating layer 6 of alumina, $Al_2O_3$ or the like covers substrates 4. Electromagnetic devices (not shown) are formed in insulating layer 6. The electromagnetic devices are typically arranged in rows and may be identically oriented. Specifically, wafer 2 is a matrix of sliders 10, which when fully processed will become sliders, such as slider 10, as illustrated in FIG. 1B.

Wafer 2 may be of any convenient size, such as four inches or six inches in diameter. Wafers of other shapes, such as a square, may be utilized. Wafer 2 may be processed to contain any desirable number of rows of sliders 10 and any number of sliders 10 within a row. Limitations to the number of sliders 10 that may be fabricated on the wafer include factors, such as the wafer size, the slider dimensions, and the amount of separation needed between sliders 10 to separate them from wafer 2.

Figure 1B:
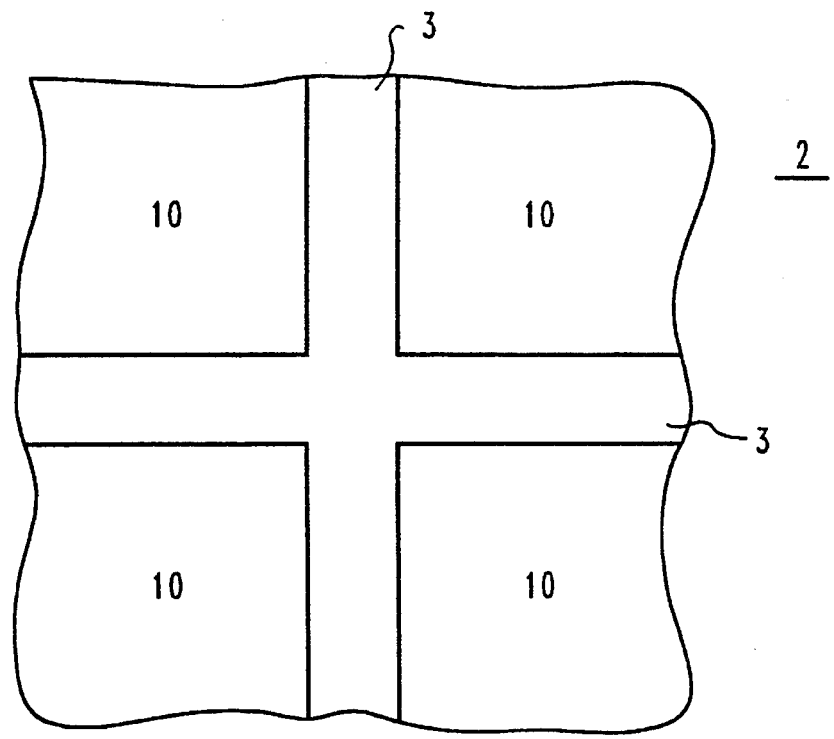

Referring to FIG. 1B, an enlarged view of a portion of wafer 2 is depicted according to a preferred embodiment of the present invention. Sliders 10 are defined by segments 3, also referred to as "scribe lines". These segments 3 encompass a number of regions in which a slider 10 is contained. Sliders 10 typically are separated from each other by cutting wafer 2 along segments 3. According to the present invention, a process for creating scribe lines or segments is provided in which damage to sliders 10 is minimized during the cutting of wafer 2.

Figure 1C:
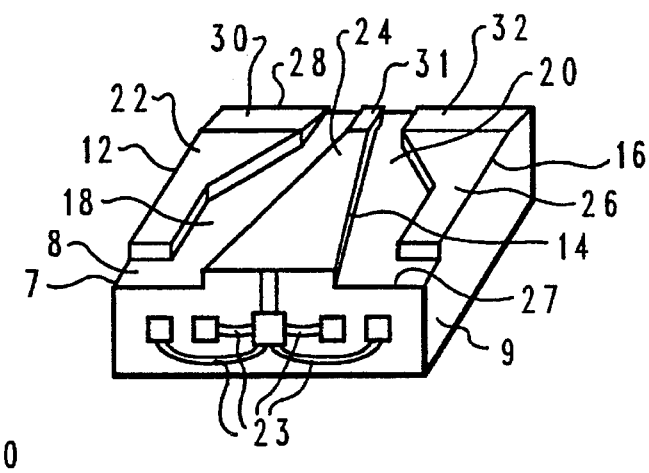

Next, FIG. 1C depicts a slider 10 separated from wafer 2 of FIG. 1A. Top surface 8 of slider 10 has three rails 12, 14, and 16. Rail 12 is adjacent to side 7, and rail 16 is adjacent to side 9. Recessed sections 18 and 20 are found between the rails. Rails 12, 14, and 16 are typically 6 µm to 20 µm above recessed sections 18 and 20. Rails 12, 14, and 16 provide air bearing surfaces (ABSs) 22, 24, and 26. Leading edge 28 of slider 10 includes tapered sections 30, 31 and 32. Slider 10 may include one or more electromagnetic devices 23, which are used to detect written data or to write data on a magnetic media, as depicted on the side of back edge 27 of slider 10. By separating slider 10 from wafer 2 utilizing a process in accordance with a preferred embodiment of the present invention, chips and cracks in slider 10 are reduced to increase slider yields from wafer 2.

With reference to FIGS. 2A–2C, cross-sectional views of a slider 40 are depicted in accordance with a preferred embodiment of the present invention. In FIG. 2A, slider 40 is constructed on substrate 41, which has an undercoat layer 42, comprised of alumina, formed on top of it. Undercoat layer 42 is typically formed on substrate 41 utilizing a sputtering process that deposits alumina on substrate 41. Those skilled in the art will realize that other methods, such as chemical vapor deposition (CVD) also may be employed to deposit alumina on substrate 41. Electronic device 46 is formed on undercoat layer 42. In addition, stud 48 also is formed on undercoat layer 42. Stud 48 is typically formed utilizing a copper plating process well known to those skilled in the art. Thereafter, overcoat layer 50, also comprised of alumina, is formed over electronic device 46 and copper stud 48. Copper stud 48 is connected to electronic device 46 and provides an electrical connection between electronic device 46 and an external device. A portion of overcoat layer 50 is removed to expose the top of copper stud 48. Typically, overcoat layer 50 is removed via a lapping process well known to those skilled in the art. The top of copper stud 48 is covered with gold pad 49 after being exposed.

A slider typically has two or more copper studs. A slider that is designed to be a magnetoresistive (MR) head may include read and write circuitry within electronic device 46 in FIGS. 2A–2C. Such a slider requires four studs: two for the read portion of the device and two for the write portion of the device. In an inductive head, typically only two studs are required, since a single electronic device is utilized for both read and write functions.

Next, photoresist layer 52 is formed over overcoat layer 50 and gold pad 49, as depicted in FIG. 2B. Grooves 54a and 54b are created in photoresist layer 52 to expose portions of overcoat layer 50. Thereafter, the alumina within overcoat layer 50 and undercoat layer 42 is etched away to expose substrate 41 and form channels 56a and 56b, as illustrated in FIG. 3C. Thereafter, slider 40 may be separated from the rest of the wafer by cutting the substrate at channels 56a and 56b.

The properties of the alumina in overcoat layer 50 and undercoat layer 42 result in channels 56a and 56b having more sloped sidewalls, due to the isotropic etch. Such a result may be unacceptable for sliders with very thick overcoats.

Typically, wafers used for fabricating sliders range from about 1 mm to about 4 mm in thickness, depending upon the final slider length desired. The total alumina thickness ranges from about 25 µm to about 75 µm, depending upon the slider design. This alumina thickness includes the undercoat, insulating gaps created during the fabrication process, and the overcoat for encapsulation of the electronic device. The undercoat thickness typically ranges from about 2 µm to about 50 µm, while the overcoat thicknesses typically ranges from about 15 µm to about 40 µm.

The process depicted in FIGS. 2A–2C works best in sliders having a total alumina thickness which is less than or equal to about 20 µm. In such a situation, copper structures may be employed to produce more vertical sidewalls in accordance with the preferred embodiment of the present invention. In etching alumina overcoats and alumina undercoats, etchants such as, for example, hot phosphoric acid or some alkaline solutions may be employed. A metal layer mask together with or instead of the photoresist on the protected area is desirable if the etchant temperature is higher than 85° C. and/or the Ph is greater than 11. Completed scribe channels are generated after alumina etching and copper wall etching.

Figure 3D:
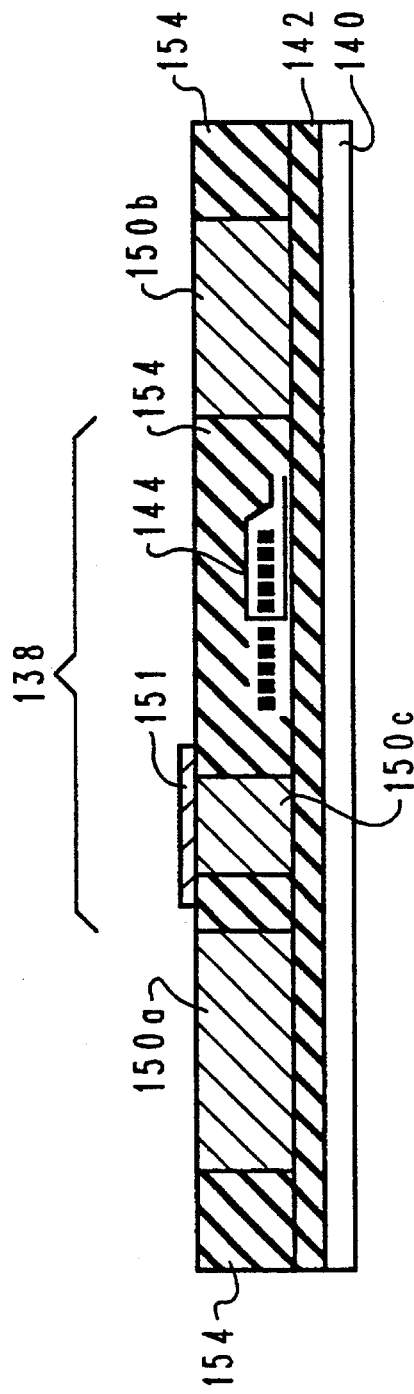
Figure 3E:
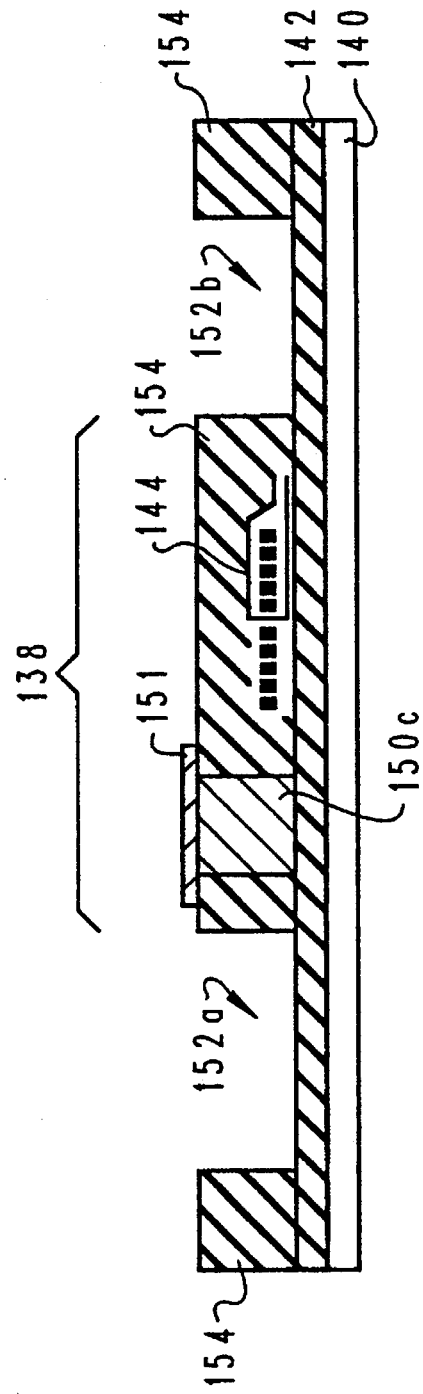

FIGS. 3A–3E are cross-sectional views of a slider in accordance with a preferred embodiment of the present invention. Referring to FIG. 3A, a cross-sectional view of a slider 138 is depicted. Undercoat layer 142 is formed on substrate 140. Undercoat layer 142 is a first insulating layer and, as mentioned above, is typically comprised of alumina. Electronic device 144 is constructed on undercoat layer 142 within slider 138. Photoresist layer 146 is then deposited over undercoat layer 142 and on top of electronic device 144. A seed layer (not shown) may be deposited over undercoat layer 142 prior to the deposition of photoresist layer 146 when a plating process is employed during fabrication of the slider. The seed layer is a conductive layer utilized during the plating process. Seed layers are well known by those of ordinary skill in the art.

Openings 148a–148c are then formed in photoresist layer 146 to expose portions of undercoat layer 142. Next, copper is plated in gaps 148a–148c to produce copper structures 150a and 150b and copper stud 150c, as illustrated in FIG. 3B. The copper structures form "boundary segments", which define the scribe lines. Thereafter, photoresist layer 146 is removed, as shown in FIG. 3C. In FIG. 3C, a second insulating layer, overcoat layer 154, is then deposited and lapped back to expose the tops of copper structures 150a and 150b and copper stud 150c. A gold pad 151 is formed on copper stud 150c as shown in FIG. 3D. Thereafter, in FIG. 3E, copper structures 150a and 150b are etched back to expose undercoat layer 142, forming channels 152a and 152b, which form the scribe lines in accordance with a preferred embodiment of the present invention. These scribe lines may be cut to separate slider 138 from the rest of the wafer while minimizing damage to electronic device 144 within slider 138. The process depicted in FIGS. 3A–3E works best for sliders with thin undercoats having a thickness of less than about 10 μm.

In another embodiment of the present invention, a copper structure may be placed along the edges of the sliders to be protected from damage caused by cutting the wafer. The copper structures may be constructed during the copper plating step utilized to form copper studs. These copper structures should be tall enough to be exposed after the overcoat is deposited and lapped. After gold plating of the studs, photoresist is patterned to cover the active row area and the copper wall surface. The overcoat and the undercoat in the unprotected areas are chemically etched away.

Figure 4A:
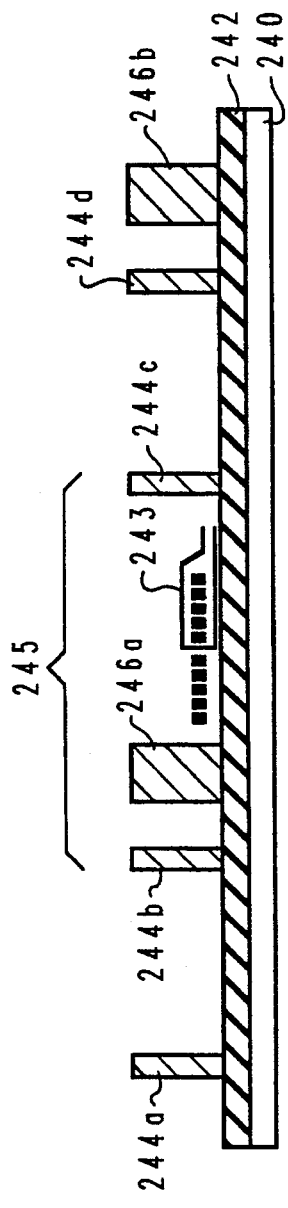

Referring to FIGS. 4A–4E, cross-sections of a slider 245 during processing are depicted in accordance with a preferred embodiment of the present invention. In FIG. 4A, substrate 240 has an undercoat layer 242 formed over it. Electronic device 243 is constructed on top of undercoat layer 242 in slider 245. Copper structures 244a–244d are formed on undercoat layer 242. The copper structures form "boundary segments", which define the scribe lines. In addition, copper studs 246a and 246b are formed on undercoat layer 242. In accordance with a preferred embodiment of the present invention, the copper structures and copper studs may be constructed by a copper plating process or sputter deposition process well known to those of ordinary skill in the art.

Figure 4B:
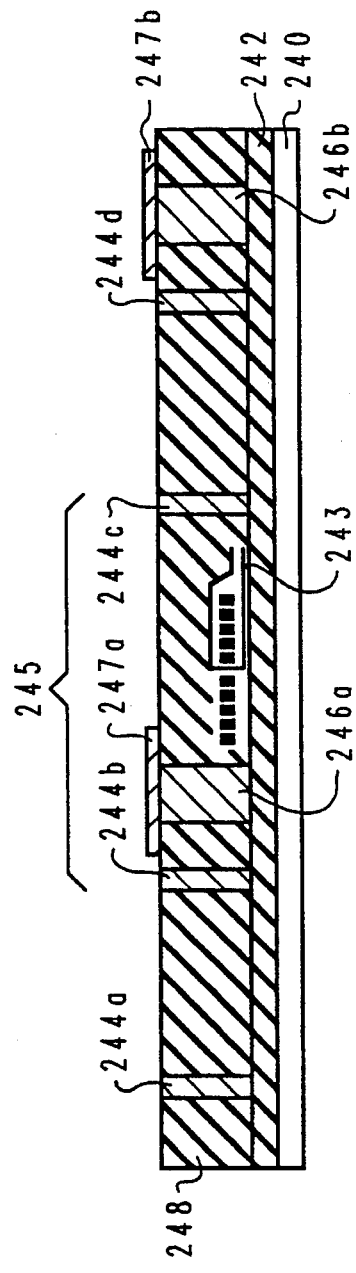
Figure 4C:
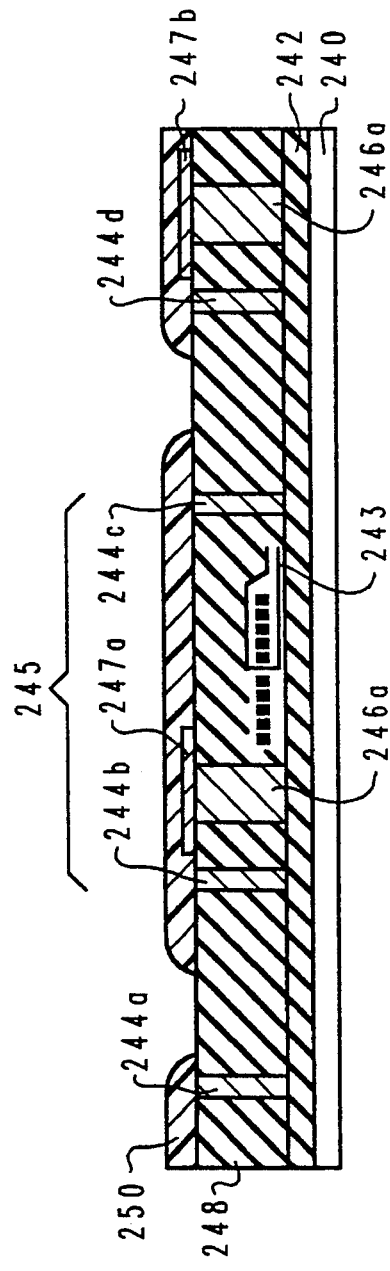

Overcoat layer 248 is formed over undercoat layer 242, electronic device 243 and copper structures 244a–244d and copper studs 246a and 246b as depicted in FIG. 4B. As can be seen in FIG. 4B, overcoat layer 248 is lapped to expose the tops of copper structures 244a–244d, and copper studs 246a and 246b. Gold pads 247a and 247b are formed over copper studs 246a and 246b. Thereafter, overcoat layer 248 is patterned with photoresist layer 250 to selectively etch the alumina in the overcoat layer 248 and undercoat layer 242 in FIG. 4C. In FIG. 4D, channels 252a and 252b are produced by etching the alumina, exposing substrate 240. Copper structures 244a–244d aid in the minimizing of undercut regions 254a–254d caused by etching. Referring now to FIG. 4E, copper structures 244a–244d are removed by chemical etching, and resulting channels 252a and 252b form scribe lines that may be cut to separate slider 245 from the wafer while minimizing damage to electronic device 243.

In another embodiment of the present invention, the undercoat layer is etched prior to the copper stud plating step. Only narrow channels of the undercoat are etched in accordance with a preferred embodiment of the present invention. Thereafter, copper studs and copper structures are created inside the etched channels. The structures are tall enough to be exposed after the overcoat is lapped. After the copper studs are plated with gold to form gold pads, the copper structures are etched away, leaving channels free of overcoat and undercoat adjacent to the edges of the rows. The width of the channels is selected such that alumina is not left behind after the row parting process.

Referring to FIGS. 5A–5F, cross-sectional views of a slider 345 during processing are depicted in accordance with a preferred embodiment of the present invention. In this particular embodiment, a pair of parallel channels are created defining scribe lines for separating a slider from the rest of the wafer. The pair of parallel scribe lines defines the edges of a slider. A segment of alumina is located between the pair of scribe lines. The wafer may be cut at the segment to separate the slider from the rest of the wafer while minimizing the probability of damage to the slider in accordance with a preferred embodiment of the present invention.

Figure 5D:
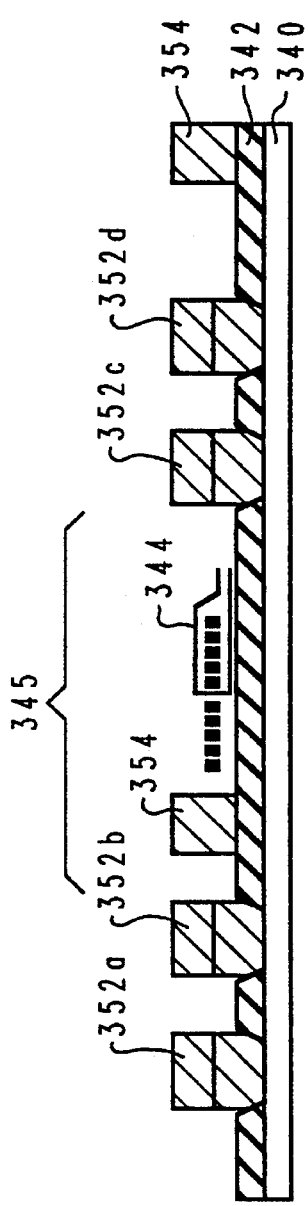

Referring first to FIG. 5A, substrate 340 has an undercoat layer 342 formed on top of it. Electronic device 344 is formed on undercoat layer 342 in slider 345. Photoresist layer 246 is patterned over undercoat layer 342 and electronic device 344. Openings 248a–248d are present in photoresist layer 346 exposing portions of undercoat layer 342. In FIG. 5B undercoat layer 342 is etched to create channels 350a–350d in undercoat layer 342, and photoresist layer 346 is removed thereafter. Copper structures 352a–352d, form "boundary segments" defining scribe lines, are plated in channels 350a–350b as depicted in FIG. 5C. The height of copper structures 352a–352d is increased and copper studs 354a and 354b are constructed through a copper plating process in FIG. 5D.

Figure 5E:
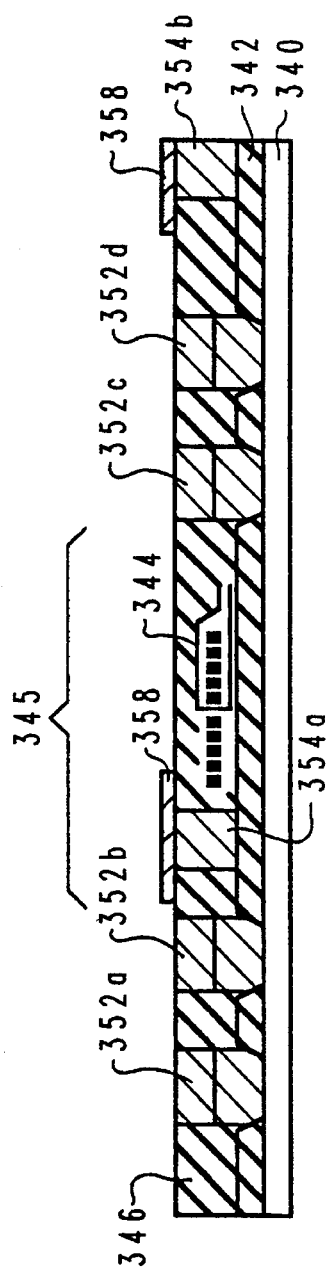
Figure 5F:
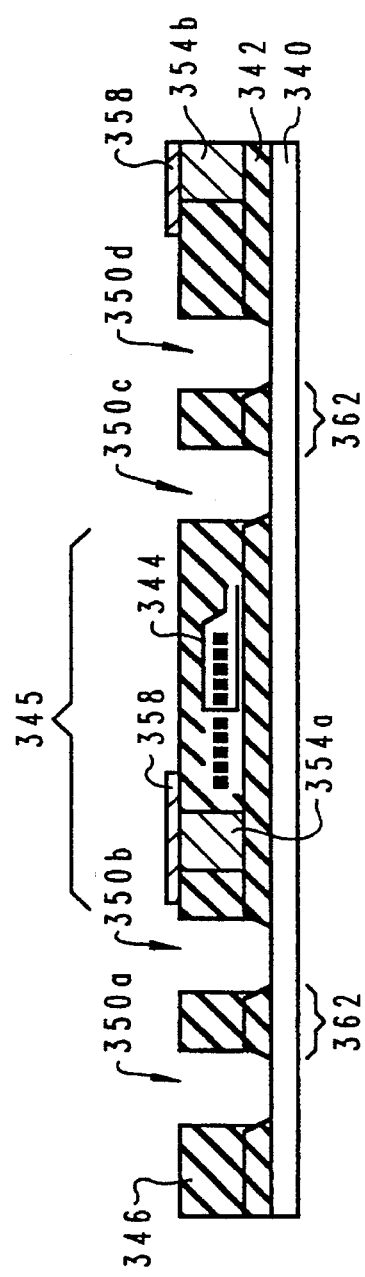

Thereafter, in FIG. 5E, overcoat layer 346 is deposited over copper structures 352a–352d, copper studs 354, electronic device 344 and undercoat layer 342. Overcoat layer 346 is lapped to expose the tops of copper structures 352a–352d and copper studs 354a and 354b in FIG. 5E. In addition, gold pads 358 are formed on the tops of copper studs 354a–354b. Referring now to FIG. 5F, copper structures 352a and 352b are removed, leaving channels 350a–350d, which form double scribe lines. These double scribe lines isolate a segment 362 of alumina from slider 345 and the rest of the wafer. Segment 362 may be cut along with other segments (not shown) to separate slider 345 from the rest of the wafer, while minimizing damage to electronic device 344 within slider 345.

Those of ordinary skill in the art will realize that in etching alumina, solutions such as phosphoric acid, sodium hydroxide, potassium hydroxide, and acidic fluoride solutions are commonly used as etchants. These etchants are usually employed at temperatures from about 25° C. to about 85° C. For example, phosphoric acid at 60° C. etches alumina at about 80 nm per minute, and at 80° C. about 300 nm per minute. The fastest etchant is an acidic fluoride solution. Typically, at 55° C., alumina is etched at about 1000 nm per minute depending on the fluoride concentration. Acidic fluoride solutions will tend to undercut more causing larger undercut regions.

In addition, copper etchants employed in fabricating sliders are well known to those of ordinary skill in the art. For example, MU A and MU B may be combined to form an etchant for copper. MU A and MU B are trade names for solutions used in copper etching that are available from: MacDermid, Inc. located in Waterbury, Conn.

Copper wall thicknesses for a copper channel may be determined as follows:

Channel width>[substrate cutting wheel thickness+maximum wheel alignment tolerance+maximum wheel vibration+maximum photo alignment and process tolerances]

In determining the outer edges of copper structures when creating channels utilizing two copper structures, the channel width equation above may be used. The inner wall edges may be determined as follows:

Channel width<[substrate cutting wheel thickness−maximum wheel alignment tolerance−maximum wheel vibration−maximum photo alignment and process tolerances]

The inner wall edges should be placed such that no residual alumina is left after the substrate is cut to separate the slider from the rest of the wafer.

Problems may occasionally occur with typical resist processes employed in slider fabrication when the photoresist must be 30 μm or more higher when forming the copper structures. In such a situation, dry photoresists may be employed in place of the typical liquid photoresists. Alternatively, a more viscous liquid photoresist may be selected and/or the photoresist may be applied at slower spin speeds to achieve very thick photoresist layers in accordance with the preferred embodiment of the present invention.

Thus, using the chemical scribing processes of the present invention, more rows of sliders may be placed on a wafer to improve productivity since the processes of the present invention provide increased resolution in scribing. In addition, manufacturing time may be decreased because chemical scribing requires less time than the mechanical scribing processes currently utilized. The width and pitch of the scribe lines can be varied across the wafer by using different masks or reticles. In addition, the scribe lines may be created with any shape to fit around various features on the wafer. The scribe lines may be created with varying width or tabs along its length in accordance with a preferred embodiment of the present invention. Using the present invention, the width and placement of scribe lines may be controlled very precisely and chips, cracks, localized heating, and particulate contamination may be reduced. In addition, scribing wafers using the present invention helps eliminate residual stress in the alumina overcoat.

The copper structures form "boundary segments", which define the scribe lines in accordance with a preferred embodiment of the present invention. Scribe lines completely encompassing the slider may be scribed utilizing the present invention. Alternatively, the two scribe lines defining opposing sides of the slider, such as the slider depicted in FIG. 1C, may be scribed utilizing the present invention while two other scribe lines defining the other two sides of the slider may be scribed utilizing conventional scribing methods. This combination of scribing utilizing the present invention and conventional scribing methods may be employed when only parts of the slider are likely to be damaged when the wafer is cut.

The description of the preferred embodiments of the present invention has been presented for purposes of illustration and description, but is not intended to be exhaustive or limit the invention in the precise form disclosed. Obviously, many modifications and variations will be apparent to practitioners skilled in the art. The embodiments were chosen and described in order to best explain the principles of the invention and the practical application to enable others skilled in the art to understand the invention for various embodiments and with various modifications as are suited to the particular use contemplated.

What is claimed is:

1. A method for creating scribe lines on a wafer having an electronic device constructed therein, said method comprising:

forming a plurality of boundary segments to define a region on said wafer, wherein said region encompasses said electronic device;

forming an insulating layer over said plurality of boundary segments, wherein said insulating layer covers said electronic device;

removing a portion of said insulating layer such that each of said plurality of boundary segments is exposed; and etching away said plurality of boundary segments to expose said wafer and form a plurality of scribe lines, wherein cutting said wafer at said scribe lines to separate said electronic device from said wafer minimizes damage to said electronic device.

2. The method of claim 1, wherein said step of forming a plurality of boundary segments comprises:

etching a pair of trenches for each of said plurality of boundary segments, wherein each pair of trenches is substantially parallel to each other; and forming a temporary structure in each trench, wherein each temporary structure rises above each trench, wherein a plurality of temporary structures are formed.

3. The method of claim 2, wherein said wafer includes a substrate and wherein said step of etching away said plurality of boundary segments comprises etching away said plurality of temporary structures to expose said substrate, wherein a pair of channels is formed in place of said plurality of temporary structures and wherein a separation structure is left behind located between each pair of channels such that cutting the separation structure when separating said electronic device from the wafer minimizes damage to said electronic device.

4. The method of claim 1, wherein said step of forming a plurality of boundary segments comprises forming a pair of protective structures for each of said plurality of boundary segments, wherein a channel is created between each of said pair of protective structures.

5. The method of claim 4, wherein said step of etching away said plurality of boundary segments comprises:

etching away said insulating material layer to expose said channel; and etching away each pair of protective structures to form a plurality of scribe lines, wherein said wafer may be electronic device from said wafer while minimizing damage to said electronic device.

6. The method of claim 1, wherein said step of forming a plurality of boundary segments includes forming each of said plurality of boundary segments to a height.

7. A method for creating a scribe line on a wafer, wherein said wafer includes a substrate and a first insulating layer on said substrate, said method comprising:

forming a pair of boundary segments on said first insulating layer, said pair of boundary segments being substantially parallel to each other, wherein said pair of boundary segments defines a scribe line;

forming a second insulating layer over said pair of boundary segments;

removing a portion of said second insulating layer to expose said pair of boundary segments;

etching away said second and first insulating layers from between said boundary segments to expose said substrate; and removing said boundary segments to form said scribe line, wherein said wafer is cut at said scribe line and wherein defects, from cutting said wafer, in said first and second insulating layers are reduced.

8. The method of claim 7, wherein said step of forming a pair of boundary segments includes forming a pair of copper walls, each having a height and a width, wherein a channel having a width is formed between said boundary segments.

9. The method of claim 8, wherein said step of forming a pair of copper walls comprises:

depositing photoresist on said wafer;

removing photoresist from said wafer to expose said wafer in sections where said pair of copper walls are to be formed;

forming said pair of copper walls on said exposed sections of said wafer; and removing said photoresist leaving said pair of copper walls on said wafer.

10. The method of claim 9, wherein said step of forming said pair of copper walls on said exposed sections of said wafer includes performing a copper plating process on said exposed sections of wafer to form said pair of copper walls.

11. The method of claim 9, wherein said step of forming said pair of copper walls on said exposed sections of said wafer includes performing a sputtering process on said wafer to deposit copper onto exposed sections of said wafer, wherein said pair of copper walls is formed.

12. The method of claim 7, wherein said step of forming a pair of boundary segments further comprises forming a pair of boundary segments, such that said pair of boundary segments encompasses a region including an electronic device for a slider.

13. The method of claim 7, wherein said step of forming a pair of boundary segments includes forming a pair of boundary segments on said first insulating layer, said pair of boundary segments being substantially parallel to each other, wherein said pair of boundary segments defines a scribe line is wherein said first insulating layer is a layer of alumina.

14. The method of claim 13, wherein said step of forming a second insulating layer comprises depositing a layer of alumina.

15. The method of claim 14, wherein said step of forming a pair of boundary segments comprises forming a pair of copper segments.

16. A method for creating a scribe line on a wafer, wherein said wafer includes a substrate and a first insulating layer on said substrate, said method comprising:

etching away a portion of said first insulating layer to form a pair of trenches;

forming a structure in each of said pair of trenches;

forming a second insulating layer on said wafer wherein said second insulating layer covers said structures;

removing a portion of said second insulating layer to expose said structures; and removing said structures to form a pair of trenches, wherein a portion of said first insulating layer, said second insulating layer, and said substrate is between a pair of trenches forming a scribe line that is cut and wherein defects in said first and second insulating layers outside of said pair of trenches are reduced.

17. The method of claim 16, wherein said step of etching away a portion of said insulating layer to form a pair of trenches comprises etching away an alumina insulating layer.

18. The method of claim 17, wherein said step of forming a second insulating layer comprises depositing a layer of alumina on said wafer.

19. A method for fabricating a slider from a wafer having a substrate, said method comprising:

depositing an undercoat on said substrate;

selectively etching away said undercoat to form a pair of grooves, each groove being substantially parallel to the other groove, wherein said pair of grooves encompasses a region for a slider;

forming an electronic device on said undercoat within said region;

forming a copper wall in each groove, wherein first and second copper walls are created and a gap is formed between the two copper walls;

forming an overcoat on said wafer;

lapping said overcoat to expose said tops of said first and second copper walls; and etching away said first and second copper walls to form a pair of parallel trenches, wherein a guide structure is formed in between said pair of parallel trenches.

20. The method of claim 19 further comprising:

prior to forming an overcoat;

forming a copper stud on said undercoat within said region, said copper stud being connected to said electronic device, wherein said cooper stud provides an electrical connection between said electronic device and an external device;

cutting said guide structure to separate said slider from said wafer.

21. A method for fabricating a slider from a wafer having a substrate, said method comprising:

depositing an undercoat on said substrate;

forming an electronic device on said undercoat;

forming a plurality of copper walls, wherein said plurality of copper walls defines a region for a slider, said region encompassing said electronic device wherein each copper wall has a top;

forming an overcoat on said wafer; and lapping said overcoat to expose said top of said copper walls; and etching away said copper walls, wherein said wafer is chemically etched.

22. The method of claim 21 further comprising:

prior to said step of forming on overcoat, forming a copper stud on said undercoat within said region, said copper stud being connected to said electronic device, wherein said cooper stud provides an electrical connection between said electronic device and an external device.

23. The method of claim 21, wherein said step of forming a plurality of copper walls comprises forming a first copper wall and second copper wall, wherein said first copper wall is parallel to said second copper wall and said slider lies between said first copper wall and said second copper wall.

24. The method of claim 21, wherein said step of forming a plurality of copper walls comprises forming four copper walls wherein said copper walls form a rectangular region encompassing said electronic device.

25. A method for fabricating a slider from a wafer having a substrate, said method comprising:

depositing an undercoat on said substrate;

forming an electronic device on said undercoat;

forming a plurality of segments, each segment including a pair of copper walls, each copper wall in a pair of copper walls being substantially parallel to said other copper wall in said pair of copper walls, wherein said plurality of segments defines a region for a slider, said region encompassing said electronic device;

forming an overcoat on said wafer;

lapping said overcoat to expose said tops of said first and second copper walls; and etching away said first and second walls, wherein said wafer is chemically etched.

26. The method of claim 25 further comprising:

prior to said step of forming an overcoat, forming a copper stud on said undercoat within said region, said copper stud being connected to said electronic device, wherein said copper stud provides an electrical connection between said electronic device and an external device.

* * * * *